(12) United States Patent
Baek et al.

(10) Patent No.: US 11,997,900 B2
(45) Date of Patent: May 28, 2024

(54) DISPLAY PANEL AND DISPLAY APPARATUS INCLUDING THE SAME

(71) Applicant: SAMSUNG DISPLAY CO., LTD., Yongin-si (KR)

(72) Inventors: Kyunghyun Baek, Suwon-si (KR); Seok Je Seong, Seongnam-si (KR); Hyeonsik Kim, Yongin-si (KR); Yoonjee Shin, Hwaseong-si (KR); Jae Hyun Lee, Seoul (KR); Woo Ho Jeong, Anyang-si (KR); Yoon-Jong Cho, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/933,470

(22) Filed: Sep. 19, 2022

(65) Prior Publication Data

US 2023/0011885 A1 Jan. 12, 2023

Related U.S. Application Data

(63) Continuation of application No. 16/844,435, filed on Apr. 9, 2020, now Pat. No. 11,450,725.

(30) Foreign Application Priority Data

Sep. 5, 2019 (KR) .................. 10-2019-0109988

(51) Int. Cl.
*H10K 59/131* (2023.01)
*H01L 27/12* (2006.01)
(Continued)

(52) U.S. Cl.
CPC ..... *H10K 59/131* (2023.02); *H01L 29/78645* (2013.01); *H10K 59/1213* (2023.02);
(Continued)

(58) Field of Classification Search
CPC .......... H04M 1/0266; H01L 29/78645; H01L 27/124; H01L 27/1248; H10K 59/124; H10K 59/131; H10K 59/1213
See application file for complete search history.

(56) References Cited

U.S. PATENT DOCUMENTS

2017/0077192 A1\* 3/2017 Jang ................... H10K 59/12
2017/0124958 A1\* 5/2017 Pyo .................... G09G 3/3291
(Continued)

FOREIGN PATENT DOCUMENTS

KR 10-2018-0090740 A 8/2018
KR 10-2018-0091984 A 8/2018
KR 10-2019-0042132 A 4/2019

*Primary Examiner* — Vongsavanh Sengdara
(74) *Attorney, Agent, or Firm* — Lewis Roca Rothgerber Christie LLP

(57) ABSTRACT

A display panel includes two or more gate layers including a plurality of gate patterns extending in a first direction and one or more source-drain layers including a plurality of source-drain patterns extending in a second direction crossing the first direction. The gate patterns of the two or more gate layers are curved or bent along a hole surrounding area corresponding to a periphery of a hole in an active area. The source-drain patterns of the one or more source-drain layers are curved or bent along the hole surrounding area. The gate patterns of at least one of the two or more gate layers overlap the source-drain patterns of at least one of the one or more source-drain layers in a thickness direction of the display panel in the hole surrounding area.

15 Claims, 11 Drawing Sheets

(51) Int. Cl.
*H01L 29/786* (2006.01)
*H10K 59/121* (2023.01)
*H10K 59/124* (2023.01)

(52) U.S. Cl.
CPC .......... *H10K 59/124* (2023.02); *H01L 27/124* (2013.01); *H01L 27/1248* (2013.01)

(56) References Cited

U.S. PATENT DOCUMENTS

| | | | |
|---|---|---|---|
| 2017/0154566 A1* | 6/2017 | Ryoo | H10K 59/131 |
| 2017/0162637 A1* | 6/2017 | Choi | H10K 59/131 |
| 2017/0294502 A1* | 10/2017 | Ka | H10K 59/131 |
| 2017/0329189 A1* | 11/2017 | Kim | H10K 10/482 |
| 2020/0236259 A1* | 7/2020 | Nakamura | H10K 59/65 |

* cited by examiner

DISPLAY PANEL AND DISPLAY APPARATUS INCLUDING THE SAME

CROSS-REFERENCE TO RELATED APPLICATIONS

This application is a continuation of U.S. patent application Ser. No. 16/844,435, filed Apr. 9, 2020, which claims priority to and the benefit of Korean Patent Application No. 10-2019-0109988, filed Sep. 5, 2019, the entire content of both of which is incorporated herein by reference.

BACKGROUND

1. Field

Example embodiments of the present inventive concept relate to a display panel and a display apparatus including the display panel. More particularly, example embodiments of the present inventive concept relate to a display panel including a hole and a display apparatus including the display panel.

2. Description of the Related Art

A display panel has a hole that is in an arrangement relationship with other elements such as a camera. Gate lines and data lines disposed adjacent to a hole surrounding area may be curved or bent to detour the hole. A dead space may be generated adjacent to the hole surrounding area by the gate lines and the data lines.

SUMMARY

Aspects of example embodiments of the present inventive concept are directed toward a display panel capable of reducing a dead space adjacent to a hole surrounding area of a display panel.

Aspects of example embodiments of the present inventive concept are directed toward a display apparatus including the display panel.

In an example embodiment of a display panel according to the present inventive concept, the display panel includes two or more gate layers including a plurality of gate patterns extending in a first direction and one or more source-drain layers including a plurality of source-drain patterns extending in a second direction crossing the first direction. The gate patterns of the two or more gate layers are curved or bent along a hole surrounding area corresponding to a periphery of a hole in an active area. The source-drain patterns of the one or more source-drain layers are curved or bent along the hole surrounding area. The gate patterns of at least one of the two or more gate layers overlap the source-drain patterns of at least one of the one or more source-drain layers in a thickness direction of the display panel in the hole surrounding area.

In an example embodiment, the two or more gate layers may include a first gate layer on a first gate insulating layer, a second gate insulating layer on the first gate layer, a second gate layer on the second gate insulating layer, a first passivation layer on the second gate layer and a third gate layer on the first passivation layer.

In an example embodiment, the second gate layer may overlap the third gate layer in the thickness direction in a normal area which is not the hole surrounding area. The first gate layer may not overlap the second gate layer and the third gate layer in the thickness direction in the normal area.

In an example embodiment, the first gate layer, the second gate layer and the third gate layer may overlap one another in the thickness direction in the hole surrounding area.

In an example embodiment, the two or more gate layers may further include an organic insulating layer in the hole surrounding area and located between the second gate insulating layer and the second gate layer.

In an example embodiment, the second gate layer may overlap the third gate layer in the thickness direction in the hole surrounding area. The first gate layer may not overlap the second gate layer and the third gate layer in the thickness direction in the hole surrounding area.

In an example embodiment, the display panel may further include a pixel including a P-type transistor and an N-type transistor.

In an example embodiment, the first gate layer may include a P-type gate line configured to transmit a P-type gate signal to the P-type transistor. The second gate layer may include a back gate electrode of the P-type transistor or the N-type transistor and a connecting line of the back gate electrode. The third gate layer may include an N-type gate line configured to transmit an N-type gate signal to the N-type transistor.

In an example embodiment, the one or more source-drain layers may include a first source-drain layer, a first organic insulating layer on the first source-drain layer, a second source-drain layer on the first organic insulating layer and a second organic insulating layer on the second source-drain layer.

In an example embodiment, the first source-drain layer may not overlap the second source-drain layer in the thickness direction in a normal area which is not the hole surrounding area.

In an example embodiment, the first source-drain layer may overlap the second source-drain layer in the thickness direction in the hole surrounding area.

In an example embodiment, the display panel may further include a plurality of pixels in a matrix form. The pixels in a pixel column from among the plurality of pixels may be alternately connected to a first data line and a second data line.

In an example embodiment, the first source-drain layer may include the first data line. The second source-drain layer may include the second data line.

In an example embodiment, the display panel may include a first gate layer on a first gate insulating layer, a second gate insulating layer on the first gate layer, a second gate layer on the second gate insulating layer, a first passivation layer on the second gate layer, a third gate layer on the first passivation layer, a second passivation layer on the third gate layer, a first source-drain layer on the second passivation layer, a first organic insulating layer on the first source-drain layer, a second source-drain layer on the first organic insulating layer and a second organic insulating layer on the second source-drain layer.

In an example embodiment, the first gate layer, the second gate layer, the third gate layer, the first source-drain layer and the second source-drain layer may overlap one another in the thickness direction in the hole surrounding area.

In an example embodiment, the display panel may further include a third organic insulating layer in the hole surrounding area and located between the second gate insulating layer and the second gate layer.

In an example embodiment, the second gate layer, the third gate layer, the first source-drain layer and the second source-drain layer may overlap one another in the thickness direction in the hole surrounding area. The first gate layer may not overlap the second gate layer in the thickness direction in the hole surrounding area.

In an example embodiment, the display panel may include a first gate layer on a first gate insulating layer, a second gate insulating layer on the first gate layer, a second gate layer on the second gate insulating layer, a first passivation layer on the second gate layer, a third gate layer on the first passivation layer, a second passivation layer on the third gate layer, a source-drain layer on the second passivation layer and an organic insulating layer on the source-drain layer.

In an example embodiment, the first gate layer, the second gate layer, the third gate layer and the source-drain layer may overlap one another in the thickness direction in the hole surrounding area.

In an example embodiment of a display apparatus according to the present inventive concept, the display apparatus includes a display panel, a gate driver, a data driver and an emission driver. The display panel includes two or more gate layers including a plurality of gate patterns extending in a first direction, one or more source-drain layers including a plurality of source-drain patterns extending in a second direction crossing the first direction and a plurality of pixels connected to the plurality of gate patterns and the plurality of source-drain patterns. The gate driver is configured to provide a gate signal to the display panel. The data driver is configured to provide a data voltage to the display panel. The emission driver is configured to provide an emission signal to the display panel. The gate patterns of the two or more gate layers are curved or bent along a hole surrounding area corresponding to a periphery of a hole in an active area of the display panel. The source-drain patterns of the one or more source-drain layers are curved or bent along the hole surrounding area. The gate patterns of at least one of the two or more gate layers overlap the source-drain patterns of at least one of the one or more source-drain layers in a thickness direction of the display panel in the hole surrounding area.

According to embodiments of the display panel and the display apparatus including the display panel, when a hole is formed in an active area of a display panel and patterns on a gate layer and patterns on a source-drain layer detour the hole at a hole surrounding area, the patterns on the gate layer and the patterns on the source-drain layer are overlapped with one another in a thickness direction so that a dead space adjacent to the hole surrounding area may be reduced.

BRIEF DESCRIPTION OF THE DRAWINGS

The above and other features and aspects of the present inventive concept will become more apparent by describing in detailed example embodiments thereof with reference to the accompanying drawings, in which.

DETAILED DESCRIPTION

Hereinafter, the present inventive concept will be explained in detail with reference to the accompanying drawings.

Figure 1:
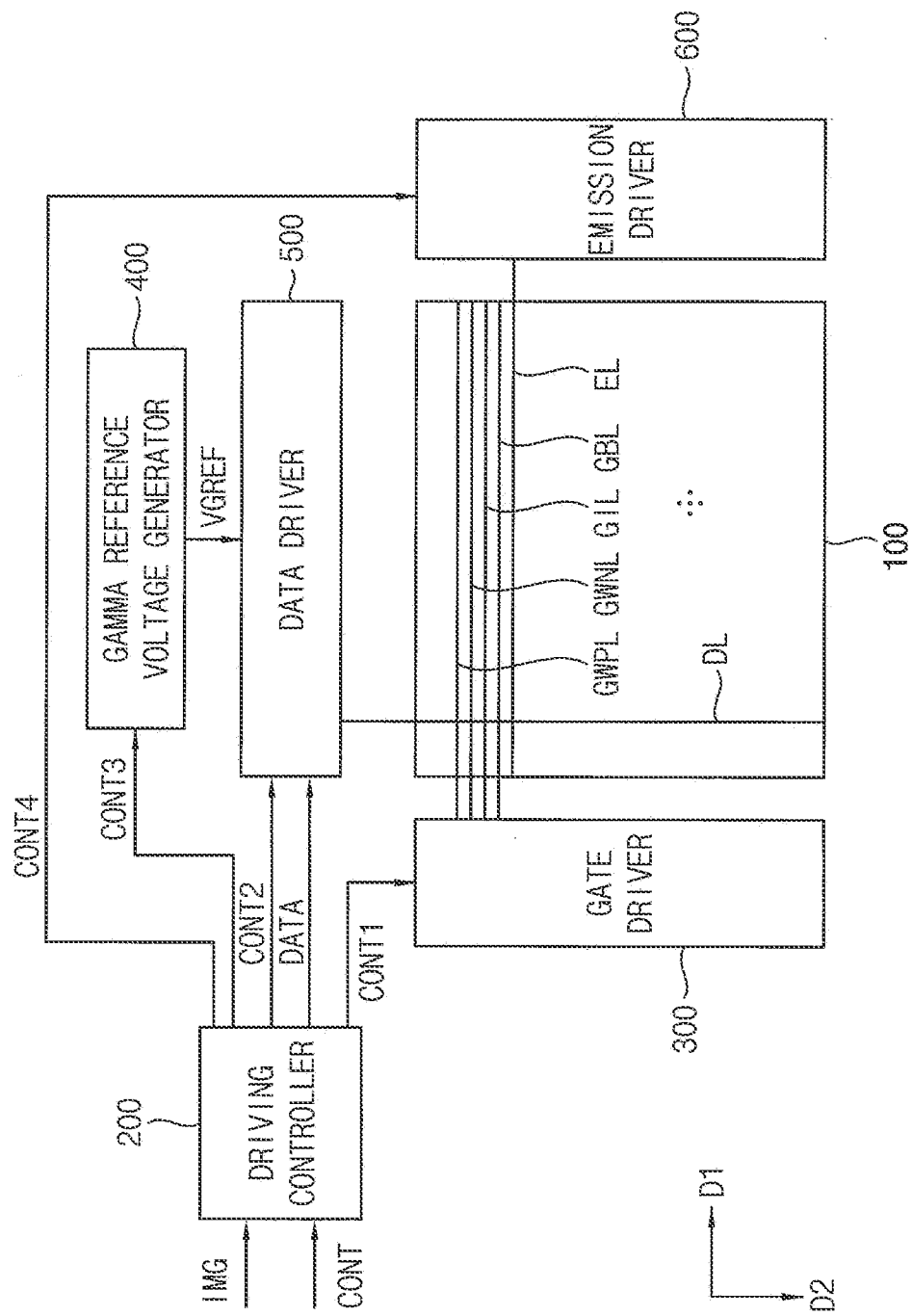
FIG. 1 is a block diagram illustrating a display apparatus according to an example embodiment of the present inventive concept.

FIG. 1 is a block diagram illustrating a display apparatus according to an example embodiment of the present inventive concept.

Referring to FIG. 1, the display apparatus includes a display panel 100 and a display panel driver. The display panel driver includes a driving controller 200, a gate driver 300, a gamma reference voltage generator 400, a data driver 500 and an emission driver 600.

The display panel 100 has a display region on which an image is displayed and a peripheral region adjacent to the display region.

The display panel 100 includes a plurality of gate lines GWPL, GWNL, GIL and GBL, a plurality of data lines DL, a plurality of emission lines EL and a plurality of pixels electrically connected to the gate lines GWPL, GWNL, GIL and GBL, the data lines DL and the emission lines EL. The gate lines GWPL, GWNL, GIL and GBL may extend in a first direction D1, the data lines DL may extend in a second direction D2 crossing the first direction D1 and the emission lines EL may extend in the first direction D1.

The driving controller 200 receives input image data IMG and an input control signal CONT from an external apparatus. For example, the input image data IMG may include red image data, green image data and blue image data. The input image data IMG may include white image data. The input image data IMG may include magenta image data, cyan image data and yellow image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3, a fourth control signal CONT4 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The driving controller 200 generates the fourth control signal CONT4 for controlling an operation of the emission driver 600 based on the input control signal CONT, and outputs the fourth control signal CONT4 to the emission driver 600.

The gate driver 300 generates gate signals driving the gate lines GWPL, GWNL, GIL and GBL in response to the first control signal CONT1 received from the driving controller 200. The gate driver 300 may sequentially output the gate signals to the gate lines GWPL, GWNL, GIL and GBL.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an example embodiment, the gamma reference voltage generator 400 may be disposed in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

The emission driver 600 generates emission signals to drive the emission lines EL in response to the fourth control signal CONT4 received from the driving controller 200. The emission driver 600 may output the emission signals to the emission lines EL.

Figure 2:
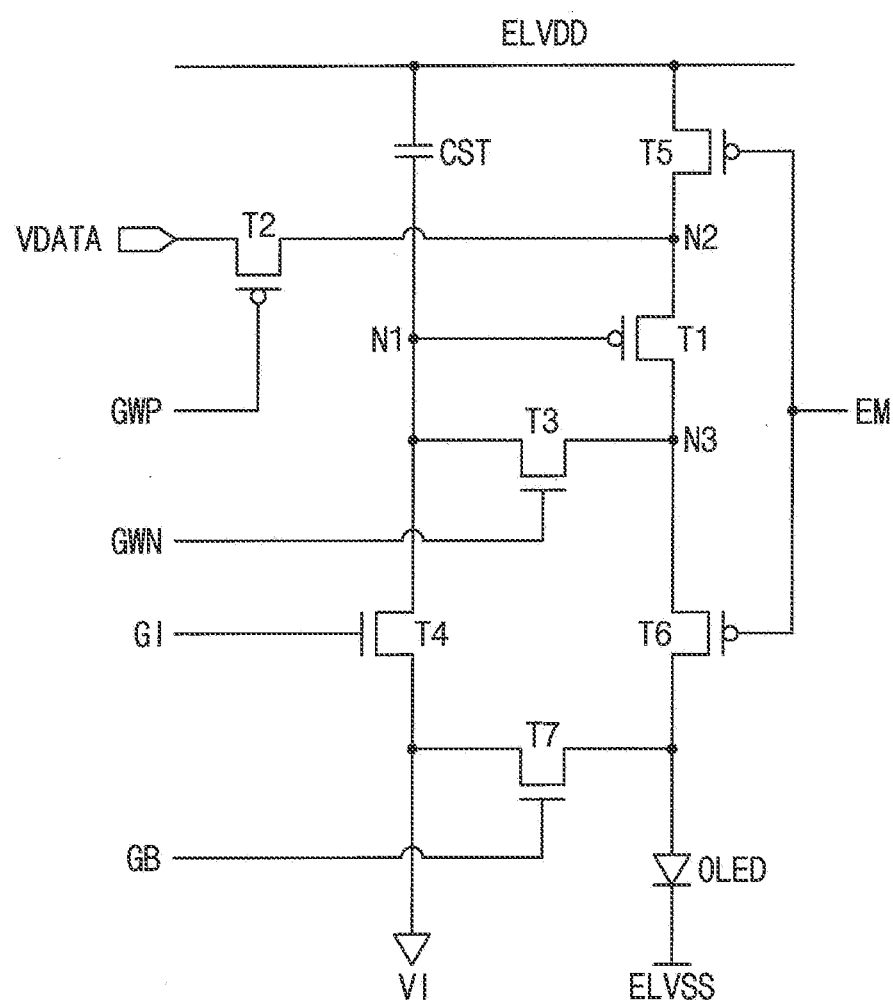
FIG. 2 is a circuit diagram illustrating a pixel of a display panel of FIG. 1.
Figure 3:
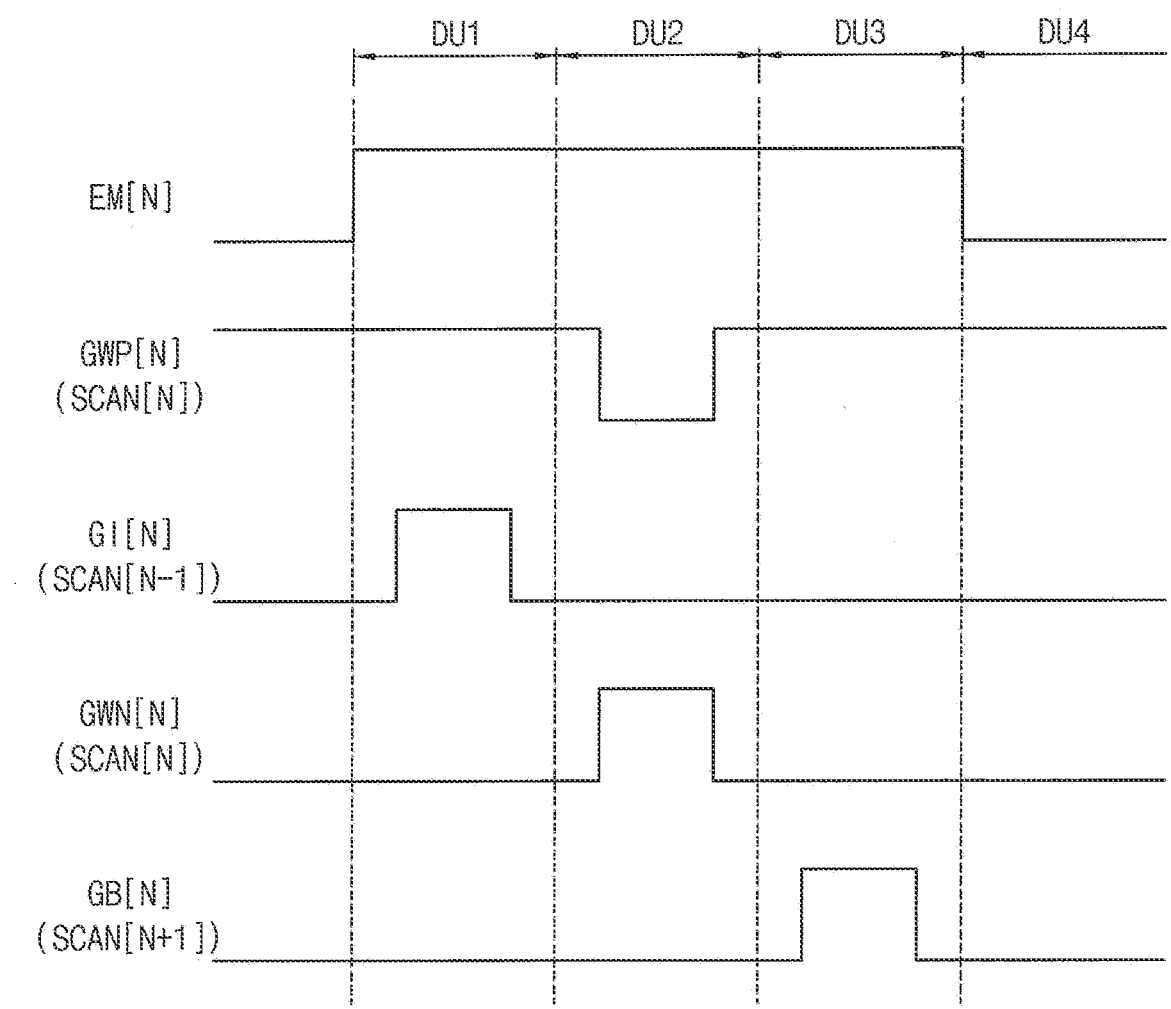
FIG. 3 is a timing diagram illustrating input signals applied to the pixel of FIG. 2.

FIG. 2 is a circuit diagram illustrating a pixel of the display panel 100 of FIG. 1. FIG. 3 is a timing diagram illustrating input signals applied to the pixel of FIG. 2.

Referring to FIGS. 1-3, the display panel 100 includes the plurality of the pixels. Each pixel includes an organic light emitting element OLED.

The pixel receives data write gate signals GWP and GWN, a data initialization gate signal GI, an organic light emitting element initialization signal GB, the data voltage VDATA and the emission signal EM, and the organic light emitting element OLED of the pixel emits light corresponding to the level of the data voltage VDATA to display the image (e.g., a portion of the image).

In the illustrated example embodiment, the pixel may include a switching element of a first type and a switching element of a second type different from the first type. In one or more example embodiments, the switching element of the first type may be a polysilicon thin film transistor, and the switching element of the second type may be an oxide thin film transistor. In one or more example embodiments, the switching element of the first type may be a low temperature polysilicon (LTPS) thin film transistor, and the switching element of the second type may be an oxide thin film transistor. In one or more example embodiments, the switching element of the first type may be a P-type transistor and the switching element of the second type may be an N-type transistor. Although different types of transistors are described with respect to the illustrated example embodiment, any suitable types may be used resulting in the pixel including a switching element of a first type and a switching element of a second type that is different from the first type.

In one or more example embodiments, the data write gate signal may include a first data write gate signal GWP and a second data write gate signal GWN. The first data write gate signal GWP may be applied to the P-type transistor so that the first data write gate signal GWP has an activation signal of a low level corresponding to a data writing timing. The second data write gate signal GWN may be applied to the N-type transistor so that the second data write gate signal GWN has an activation signal of a high level corresponding to the data writing timing.

At least one of the pixels may include first to seventh pixel switching elements T1 to T7 (i.e., a first pixel switching element T1, a second pixel switching element T2, a third pixel switching element T3, a fourth pixel switching element T4, a fifth pixel switching element T5, a sixth pixel switching element T6 and a seventh pixel switching element T7), a storage capacitor CST and the organic light emitting element OLED.

The first pixel switching element T1 includes a control electrode connected to a first node N1, an input electrode connected to a second node N2 and an output electrode connected to a third node N3.

In one or more example embodiments, the first pixel switching element T1 may be a polysilicon thin film transistor. In one or more example embodiments, the first pixel switching element T1 may be a P-type thin film transistor. The control electrode of the first pixel switching element T1 may be a gate electrode, the input electrode of the first pixel switching element T1 may be a source electrode and the output electrode of the first pixel switching element T1 may be a drain electrode.

The second pixel switching element T2 includes a control electrode to which the first data write gate signal GWP is applied, an input electrode to which the data voltage VDATA is applied and an output electrode connected to the second node N2.

In one or more example embodiments, the second pixel switching element T2 may be a polysilicon thin film transistor. In one or more example embodiments, the second pixel switching element T2 may be a P-type thin film transistor. The control electrode of the second pixel switching element T2 may be a gate electrode, the input electrode of the second pixel switching element T2 may be a source electrode, and the output electrode of the second pixel switching element T2 may be a drain electrode.

The third pixel switching element T3 includes a control electrode to which the second data write gate signal GWN is applied, an input electrode connected to the first node N1, and an output electrode connected to the third node N3.

In one or more example embodiments, the third pixel switching element T3 may be the oxide thin film transistor. In one or more example embodiments, the third pixel switching element T3 may be an N-type thin film transistor. The control electrode of the third pixel switching element T3 may be a gate electrode, the input electrode of the third pixel switching element T3 may be a source electrode, and the output electrode of the third pixel switching element T3 may be a drain electrode.

The fourth pixel switching element T4 includes a control electrode to which the data initialization gate signal GI is applied, an input electrode to which an initialization voltage VI is applied, and an output electrode connected to the first node N1.

In one or more example embodiments, the fourth pixel switching element T4 may be an oxide thin film transistor. In one or more example embodiments, the fourth pixel switching element T4 may be an N-type thin film transistor. The control electrode of the fourth pixel switching element T4 may be a gate electrode, the input electrode of the fourth pixel switching element T4 may be a source electrode and the output electrode of the fourth pixel switching element T4 may be a drain electrode.

The fifth pixel switching element T5 includes a control electrode to which the emission signal EM is applied, an input electrode to which a high power voltage ELVDD is applied, and an output electrode connected to the second node N2.

In one or more example embodiments, the fifth pixel switching element T5 may be a polysilicon thin film transistor. In one or more example embodiments, the fifth pixel switching element T5 may be a P-type thin film transistor. The control electrode of the fifth pixel switching element T5 may be a gate electrode, the input electrode of the fifth pixel switching element T5 may be a source electrode, and the output electrode of the fifth pixel switching element T5 may be a drain electrode.

The sixth pixel switching element T6 includes a control electrode to which the emission signal EM is applied, an input electrode connected to the third node N3, and an output electrode connected to an anode electrode of the organic light emitting element OLED.

In one or more example embodiments, the sixth pixel switching element T6 may be a polysilicon thin film transistor. In one or more example embodiments, the sixth pixel switching element T6 may be a P-type thin film transistor. The control electrode of the sixth pixel switching element T6 may be a gate electrode, the input electrode of the sixth pixel switching element T6 may be a source electrode, and the output electrode of the sixth pixel switching element T6 may be a drain electrode.

The seventh pixel switching element T7 includes a control electrode to which the organic light emitting element initialization gate signal GB is applied, an input electrode to which the initialization voltage VI is applied, and an output electrode connected to the anode electrode of the organic light emitting element OLED.

In one or more example embodiments, the seventh pixel switching element T7 may be an oxide thin film transistor. In one or more example embodiments, the seventh pixel switching element T7 may be an N-type thin film transistor. The control electrode of the seventh pixel switching element T7 may be a gate electrode, the input electrode of the seventh pixel switching element T7 may be a source electrode, and the output electrode of the seventh pixel switching element T7 may be a drain electrode.

Although the seventh pixel switching element is an oxide thin film transistor in the illustrated example embodiment, the present inventive concept is not limited thereto. For example, the seventh pixel switching element may be a polysilicon thin film transistor. Although the seventh pixel switching element is an N-type thin film transistor in the illustrated example embodiment, the present inventive concept is not limited thereto. For example, the seventh pixel switching element may be a P-type thin film transistor.

The storage capacitor CST includes a first electrode to which the high power voltage ELVDD is applied, and a second electrode connected to the first node N1.

The organic light emitting element OLED includes the anode electrode and a cathode electrode to which a low power voltage ELVSS is applied.

In FIG. 3, during a first duration DU1, the first node N1 and the storage capacitor CST are initialized in response to the data initialization gate signal GI (e.g., the data initialization gate signal GI is applied at a high level to the control electrode of the fourth pixel switching element T4). During a second duration DU2, a threshold voltage |VTH| of the first pixel switching element T1 is compensated in response to the first and second data write gate signals GWP and GWN (the first data write gate signal GWP is applied at a low level to the control electrode of the second pixel switching element T2 and the second data write gate signal GWN is applied at a high level to the control electrode of the third pixel switching element T3), and the data voltage VDATA of which the threshold voltage |VTH| is compensated is written to the first node N1. During a third duration DU3, the anode electrode of the organic light emitting element OLED is initialized in response to the organic light emitting element initialization gate signal GB (e.g., the organic light emitting element initialization gate signal GB is applied at a high level to the control electrode of the seventh pixel switching element T7). During a fourth duration DU4, the organic light emitting element OLED emits light in response to the emission signal EM (e.g., the emission signal EM is applied at a low level to the control electrode of the sixth pixel switching element T6) so that the display panel 100 displays the image.

Although an emission off duration of the emission signal EM corresponds to first to third durations (first duration DU1, second duration DU2 and third duration DU3) in the illustrated example embodiment, the present inventive concept is not limited thereto. The emission off duration of the emission signal EM may be set to include the data writing duration DU2. In one or more example embodiments, the emission off duration of the emission signal EM may be longer than a sum of the first to third durations DU1, DU2 and DU3.

During the first duration DU1, the data initialization gate signal GI may have an active level. For example, the active level of the data initialization gate signal GI may be a high level. When the data initialization gate signal GI has the active level, the fourth pixel switching element T4 is turned on so that the initialization voltage VI may be applied to the first node N1. The data initialization gate signal GI[N] of a present stage may be generated based on a scan signal SCAN[N−1] of a previous stage.

During the second duration DU2, the first data write gate signal GWP and the second data write gate signal GWN may have an active level. For example, the active level of the first data write gate signal GWP may be a low level and the active level of the second data write gate signal GWN may be a high level. When the first data write gate signal GWP and the second data write gate signal GWN have the active level, the second pixel switching element T2 and the third pixel switching element T3 are turned on. In addition, the first pixel switching element T1 is turned on in response to the initialization voltage VI. The first data write gate signal GWP[N] of the present stage may be generated based on a scan signal SCAN[N] of the present stage. The second data write gate signal GWN[N] of the present stage may be generated based on the scan signal SCAN[N] of the present stage.

A voltage which is generated by subtracting an absolute value |VTH| of the threshold voltage of the first pixel switching element T1 from the data voltage VDATA may be charged at the first node N1 along a path generated by the first to third pixel switching elements (i.e., first pixel switching element T1, second pixel switching element T2 and third pixel switching element T3).

During the third duration DU3, the organic light emitting element initialization signal GB may have an active level. For example, the active level of the organic light emitting element initialization signal GB may be a high level. When the organic light emitting element initialization signal GB has the active level, the seventh pixel switching element T7 is turned on so that the initialization voltage VI may be applied to the anode electrode of the organic light emitting element OLED. The organic light emitting element initialization signal GB[N] of the present stage may be generated based on a scan signal SCAN[N+1] of a next stage.

During the fourth duration DU4, the emission signal EM may have an active level. The active level of the emission signal EM may be a low level. When the emission signal EM has the active level, the fifth pixel switching element T5 and the sixth pixel switching element T6 are turned on. In addition, the first pixel switching element T1 is turned on by the data voltage VDATA.

A driving current flows through the fifth pixel switching element T5, the first pixel switching element T1 and the sixth pixel switching element T6 to drive the organic light emitting element OLED. An intensity of the driving current may be determined by the level of the data voltage VDATA. A luminance of the organic light emitting element OLED is determined by the intensity (e.g., magnitude) of the driving current applied to the OLED.

In the illustrated example embodiment, when the image displayed on the display panel 100 is a static image or the display panel is operated in Always On Mode, a driving frequency of the display panel 100 may be decreased to reduce power consumption. When all of the switching elements of the pixel of the display panel 100 are polysilicon thin film transistors, a flicker may be generated due to a leakage current of the pixel switching element in the low frequency driving mode. Thus, some of the pixel switching elements may be designed using oxide thin film transistors. In the illustrated example embodiment, the third pixel switching element T3, the fourth pixel switching element T4 and the seventh pixel switching element T7 may be oxide thin film transistors. The first pixel switching element T1, the second pixel switching element T2, the fifth pixel switching element T5 and the sixth pixel switching element T6 may be polysilicon thin film transistors. Accordingly, in the illustrated embodiment, a flicker may be reduced or prevented in the low frequency driving mode.

Although the second data write gate signal GWN is applied to the control electrode of the third pixel switching element T3 and the organic light emitting element initialization signal GB is applied to the control electrode of the seventh pixel switching element T7 in the illustrated example embodiment, the present inventive concept is not limited thereto. The control electrode of the third pixel switching element T3 may be connected to the control electrode of the seventh pixel switching element T7, and the second data write gate signal GWN may be applied to the control electrode of both the third pixel switching element T3 and the control electrode of the seventh pixel switching element T7. Therefore, in one or more example embodiments, a separate organic light emitting element initialization signal GB may be omitted.

Figure 4:
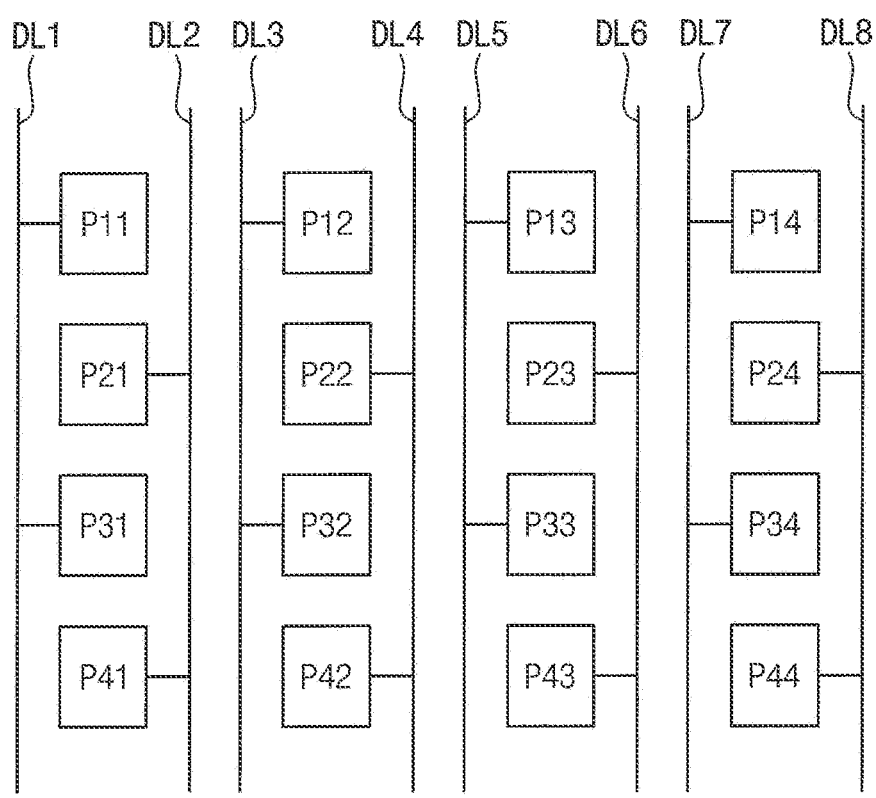
FIG. 4 is a conceptual diagram illustrating a pixel structure of the display panel of FIG. 1.

FIG. 4 is a conceptual diagram illustrating a pixel structure of the display panel 100 of FIG. 1.

Referring to FIGS. 1-4, the display panel 100 includes a plurality of pixels disposed in a matrix form.

In the illustrated example embodiment, pixels in a pixel column may be alternately connected to adjacent data lines (e.g., two adjacent data lines). For example, the pixels in the pixel column may be alternately connected to an odd numbered data line and an even numbered data line.

For example, a first pixel P11, a second pixel P21, a third pixel P31 and a fourth pixel P41 are disposed in sequential order in a pixel column of the display panel 100 where a first pixel P11 and a third pixel P31 from among the pixels are connected to a first data line DL1 (an odd numbered data line) and a second pixel P21 and a fourth pixel P41 from among the pixels are connected to a second data line DL2 (an even numbered data line). In one or more example embodiments, a first pixel P12 and a third pixel P32 from among pixels disposed in a second pixel column of the display panel 100 may be connected to a third data line DL3, and a second pixel P22 and a fourth pixel P42 from among pixels disposed in the second pixel column may be connected to a fourth data line DL4. In one or more example embodiments, a first pixel P13 and a third pixel P33 from among pixels disposed in a third pixel column of the display panel 100 may be connected to a fifth data line DL5, and a second pixel P23 and a fourth pixel P43 from among pixels disposed in the third pixel column may be connected to a sixth data line DL6. In one or more example embodiments, a first pixel P14 and a third pixel P34 from among pixels disposed in a fourth pixel column of the display panel 100 may be connected to a seventh data line DL7, and a second pixel P24 and a fourth pixel P44 from among pixels disposed in the fourth pixel column may be connected to an eighth data line DL8.

Figure 5:
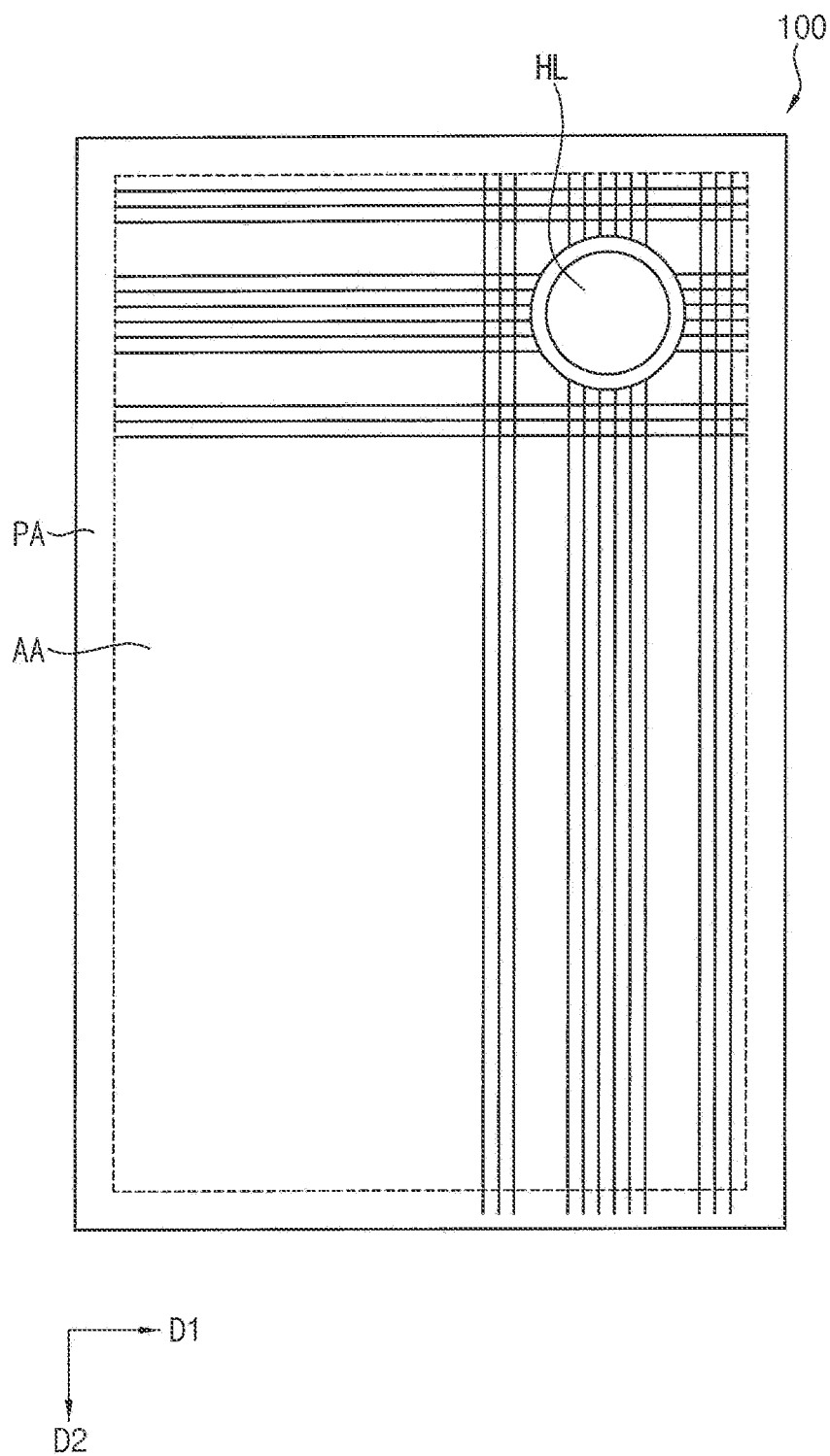
FIG. 5 is a plan view illustrating a hole, a gate layer and a source-drain layer of the display panel of FIG. 1.
Figure 6:
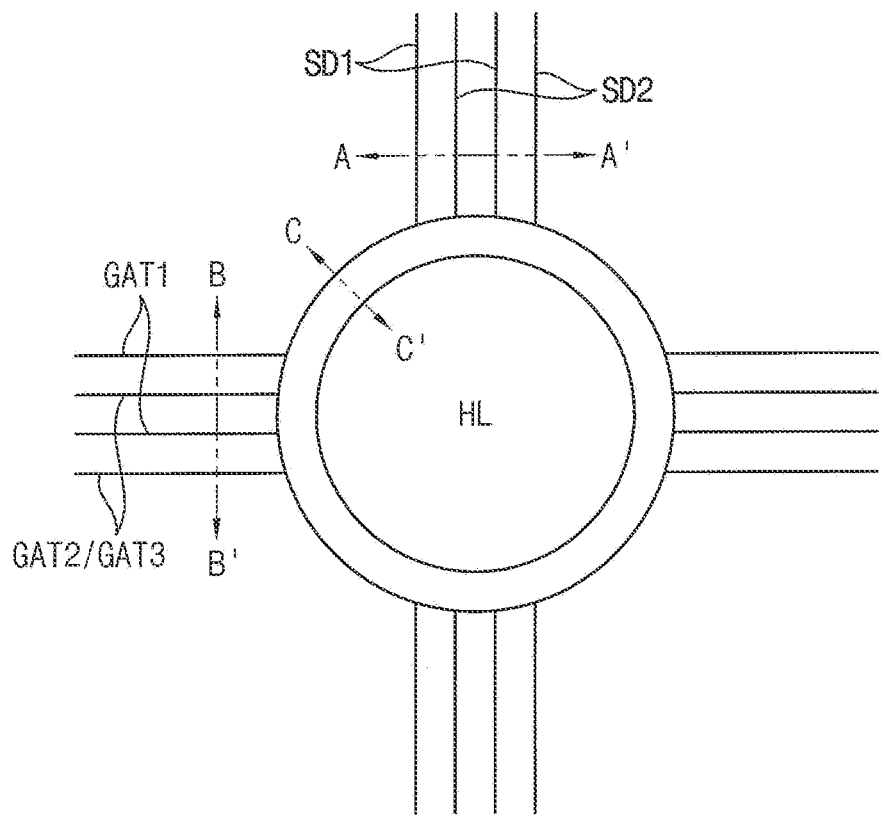
FIG. 6 is a plan view illustrating the hole of FIG. 5, a hole surrounding area and a normal area.

FIG. 5 is a plan view illustrating a hole HL, a first gate layer GAT1, a second gate layer GAT2, a third gate layer GAT3, a first source-drain layer SD1, and a second source-drain layer SD2 of the display panel of FIG. 1. FIG. 6 is a plan view illustrating the hole HL of FIG. 5, a hole surrounding area and a normal area.

Referring to FIGS. 1-6, the display panel 100 includes an active area AA where the image is displayed and a peripheral area PA surrounding the active area AA.

The hole HL may be disposed in the active area AA. The hole HL may be formed corresponding to a location of a camera module of the display apparatus. In one or more example embodiments, the hole HL may overlap a camera module of the display apparatus. The hole HL may refer to a hole which is physically formed in a base substrate of the display panel 100. In one or more example embodiments, only transparent elements are disposed in the hole HL.

The display panel 100 may include a plurality of gate layers GAT1, GAT2 and GAT3 including gate patterns extending in the first direction D1, and a plurality of source-drain layers SD1 and SD2 including source-drain patterns extending in the second direction D2.

Gate patterns of the gate layers GAT1, GAT2 and GAT3 not passing an area where the hole HL is formed (e.g., an area that does not include the hole HL) extend straight in the first direction D1. In one or more example embodiments, gate patterns of the second gate layer GAT2 and the third gate layer GAT3 not passing an area where the hole HL is formed overlap when viewed in a plan view as illustrated in FIG. 6. In one or more example embodiments, gate patterns of the gate layers GAT1, GAT2 and GAT3 passing the area where the hole HL is formed (i.e., passing an area including the hole HL and an area around the hole HL) extend straight in the first direction D1 in a normal area where the hole HL is not formed and the gate patterns of the gate layers GAT1, GAT2 and GAT3 are curved or bent along a periphery (e.g., circumference) of the hole HL in a hole surrounding area (i.e., an area that surrounds the hole HL). In one or more example embodiments, the hole surrounding area is adjacent (e.g., directly adjacent) the hole HL. In one or more example embodiments, the hole surrounding area borders the hole HL.

Source-drain patterns of the source-drain layers SD1 and SD2 not passing an area where the hole HL is formed (e.g., an area that does not include the hole HL) extend straight in the second direction D2. In one or more example embodiments, source-drain patterns of the source-drain layers SD1 and SD2 passing the area where the hole HL is formed (i.e., passing an area including the hole HL and an area around the hole HL) extend straight in the second direction D2 in the normal area where the hole HL is not formed, and the source-drain patterns of the source-drain layers SD1 and SD2 are curved or bent along the circumference of the hole HL in the hole surrounding area (i.e., the area that surrounds the hole HL).

In one or more example embodiments, the first source-drain layer SD1 and the second source-drain layer SD2 may extend in the second direction D2 and be alternately disposed in the first direction D1 in a normal area when viewed from a plan view as illustrated in the embodiment of FIG. 6. In one or more example embodiments, the first gate layer GAT1 and the third gate layer GAT3 may extend in the first direction D1 and be alternately disposed in the second direction D2 in a normal area when viewed from a plan view as illustrated in the embodiment of FIG. 6. In one or more example embodiments, the first gate layer GAT1 and the second gate layer GAT2 may extend in the first direction D1 and be alternately disposed in the second direction D2 in a normal area when viewed from a plan view as illustrated in the embodiment of FIG. 6

A portion where the gate patterns of the gate layers GAT1, GAT2 and GAT3 or the source-drain patterns of the source-drain layers SD1 and SD2 are curved or bent due to the hole HL may be defined as the hole surrounding area.

Figure 7:
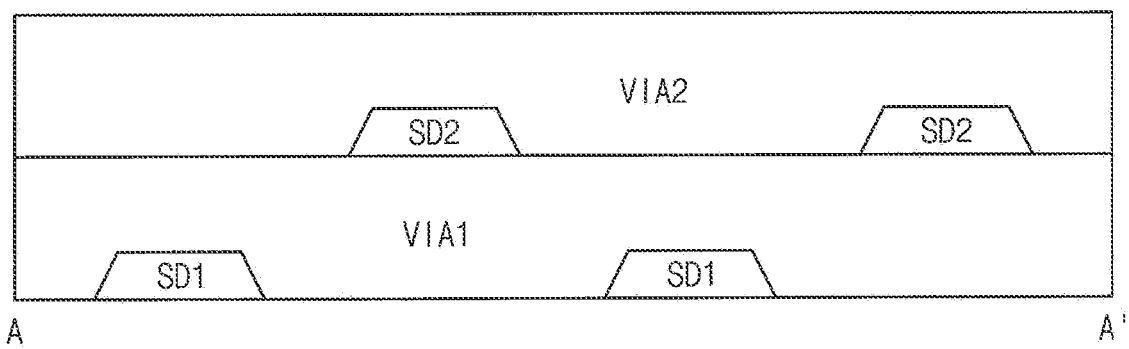
FIG. 7 is a cross-sectional view illustrating the display panel taken along the line A-A' of FIG. 6.
Figure 8:
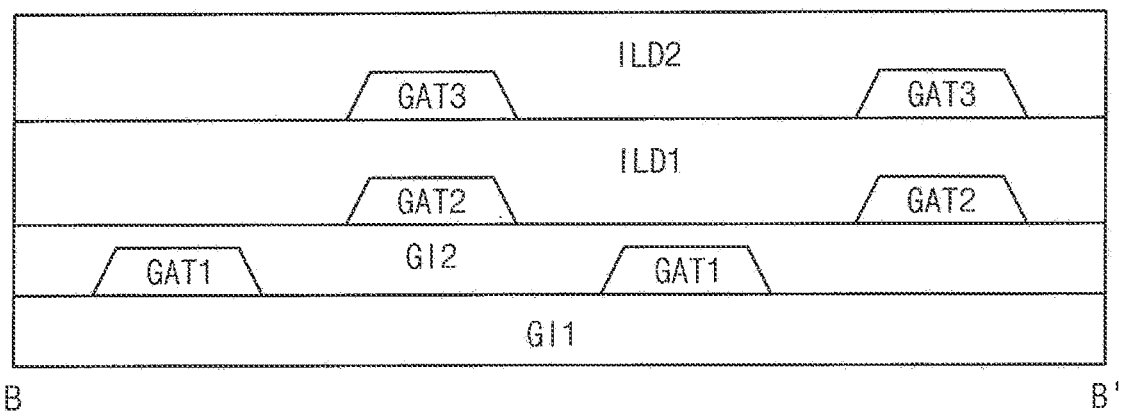
FIG. 8 is a cross-sectional view illustrating the display panel taken along the line B-B' of FIG. 6.
Figure 9:
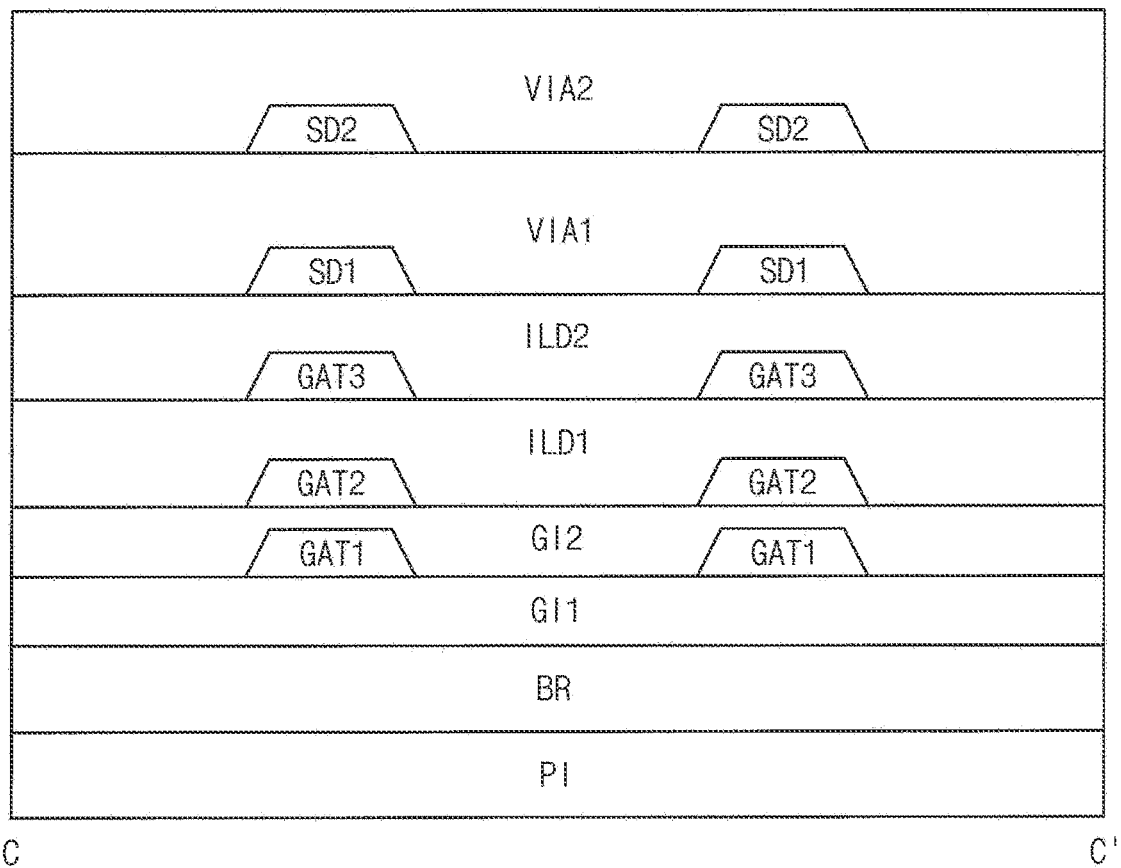
FIG. 9 is a cross-sectional view illustrating the display panel taken along the line C-C' of FIG. 6.

FIG. 7 is a cross-sectional view illustrating the display panel 100 taken along the line A-A' of FIG. 6. FIG. 8 is a cross-sectional view illustrating the display panel 100 taken along the line B-B' of FIG. 6. FIG. 9 is a cross-sectional view illustrating the display panel 100 taken along the line C-C' of FIG. 6.

The line A-A' represents a cross-sectional structure of the source-drain layers SD1 and SD2 in the normal area where the hole is not formed. The line B-B' represents a cross-sectional structure of the gate layers GAT1, GAT2 and GAT3 in the normal area where the hole is not formed. The line C-C' represents a cross-sectional structure of the gate layers GAT1, GAT2 and GAT3 and the source-drain layers SD1 and SD2 in the hole surrounding area (i.e., the area that surrounds the hole).

Referring to FIGS. 1-9, the display panel 100 includes a base layer PI, a barrier layer BR disposed on the base layer PI, a first gate insulating layer GI1 disposed on the barrier layer BR, a first gate layer GAT1 disposed on the first gate insulating layer GI1, a second gate insulating layer GI2 disposed on the first gate layer GAT1 and/or the first gate insulating layer GI1, a second gate layer GAT2 disposed on the second gate insulating layer GI2, a first passivation layer ILD1 disposed on the second gate layer GAT2 and/or the second gate insulating layer GI2, a third gate layer GAT3 disposed on the first passivation layer ILD1, a second passivation layer ILD2 disposed on the third gate layer GAT3 and/or the first passivation layer ILD1, a first source-drain layer SD1 disposed on the second passivation layer ILD2, a first organic insulating layer VIA1 disposed on the first source-drain layer SD1 and/or the second passivation layer ILD2, a second source-drain layer SD2 disposed on the first organic insulating layer VIA1 and a second organic insulating layer VIA2 disposed on the second source-drain layer SD2 and/or the first organic insulating layer VIA1.

The base layer PI may include a polyimide. The barrier layer BR may include an inorganic material. A thickness of the barrier layer BR may be between about 800 nm and about 900 nm.

The first gate insulating layer Gi1 and the second gate insulating layer GI2 may include an inorganic material. A thickness of the first gate insulating layer Gi1 may be about 150 nm. A thickness of the second gate insulating layer GI2 may be about 150 nm.

The first passivation layer ILD1 and the second passivation layer ILD2 may include an inorganic material. A thickness of the first passivation layer ILD1 and a thickness of the second passivation layer ILD2 may be greater than the thickness of the first gate insulating layer Gi1 and the thickness of the second gate insulating layer GI2. The thickness of the first passivation layer ILD1 may be between about 400 nm and about 500 nm. The thickness of the second passivation layer ILD2 may be between about 400 nm and about 500 nm.

The first organic insulating layer VIA1 and the second organic insulating layer VIA2 may include an organic insulating material. A thickness of the first organic insulating layer VIA1 and a thickness of the second organic insulating layer VIA2 may be greater than the thickness of the first gate insulating layer Gi1 and the thickness of the second gate insulating layer GI2. The thickness of the first organic insulating layer VIA1 and the thickness of the second organic insulating layer VIA2 may be greater than the thickness of the first passivation layer ILD1 and the thickness of the second passivation layer ILD2. The thickness of the first organic insulating layer VIA1 may be between about 1.5 um and about 2 um. The thickness of the second organic insulating layer VIA2 may be between about 1.5 um and about 2 um.

In an example embodiment, the first passivation layer ILD1 may be replaced with a third gate insulating layer GI3. Herein, the third gate insulating layer GI3 may include an inorganic material. A thickness of the third gate insulating layer GI3 may be about 150 nm.

As illustrated in FIG. 7, the first source-drain layer SD1 may not overlap the second source-drain layer SD2 in a thickness direction in the normal area.

The first source-drain layer SD1 may include the odd numbered data lines DL1, DL3, DL5 and DL7 in the pixel structure of FIG. 4. The second source-drain layer SD2 may include the even numbered data lines DL2, DL4, DL6 and DL8 in the pixel structure of FIG. 4. The odd numbered data lines DL1, DL3, DL5 and DL7 may not overlap the even numbered data lines DL2, DL4, DL6 and DL8 in the normal area so that the first source-drain layer SD1 may not overlap the second source-drain layer SD2 in the thickness direction in the normal area.

In contrast, as illustrated in FIG. 9, the first source-drain layer SD1 may overlap the second source-drain layer SD2 in the thickness direction in the hole surrounding area. The first source-drain layer SD1 and the second source-drain layer SD2 are not connected to the pixels in the hole surrounding area. According to one or more example embodiments, patterns on the first source-drain layer SD1 and the second source-drain layer SD2 are curved or bent in the hole surrounding area to detour the hole HL.

The first source-drain layer SD1 may overlap the second source-drain layer SD2 in the thickness direction in the hole surrounding area so that a dead space due to (or defined by) the hole HL may be reduced.

A horizontal interval of adjacent data lines on the first source-drain layer SD1 in the hole surrounding area may be less than a horizontal interval of adjacent data lines on the first source-drain layer SD1 in the normal area. A horizontal interval of adjacent data lines on the second source-drain layer SD2 in the hole surrounding area may be less than a horizontal interval of adjacent data lines on the second source-drain layer SD2 in the normal area. Thus, the dead space due to the hole HL may be further reduced in the hole surrounding area.

As illustrated in FIG. 8, the second gate layer GAT2 may overlap the third gate layer GAT3 in a thickness direction in the normal area and the first gate layer GAT1 may not overlap the second gate layer GAT2 and the third gate layer GAT3 in the thickness direction in the normal area.

The first gate layer GAT1 may include a P-type gate line GWPL outputting a P-type gate signal GWP to the P-type transistor of FIG. 2. The second gate layer GAT2 may include a back gate electrode of the P-type transistor or the N-type transistor and a connecting line of the back gate electrode. The third gate layer GAT3 may include an N-type gate line GWNL outputting an N-type gate signal GWN to the N-type transistor of FIG. 2. In one or more example embodiments, the second gate layer GAT2 may include a storage electrode overlapped with the first gate layer GAT1.

In the normal area, the first gate layer GAT1 and the second gate layer GAT2 may output gate signals having different waveforms so that the first gate layer GAT1 may not overlap the second gate layer GAT2 in the thickness direction to prevent or reduce coupling of the signals. In other words, the first gate layer GAT1 and the second gate layer GAT2 may not overlap in the thickness direction to prevent or reduce the possibility of coupling of gate signals.

In contrast, as illustrated in FIG. 9, the first gate layer GAT1, the second gate layer GAT2 and the third gate layer GAT3 may overlap one another in the thickness direction in the hole surrounding area. Patterns on the first gate layer GAT1, the second gate layer GAT2 and the third gate layer GAT3 are curved or bent to detour the hole HL in the hole surrounding area.

The first gate layer GAT1, the second gate layer GAT2 and the third gate layer GAT3 may overlap one another in the thickness direction in the hole surrounding area so that a dead space due to the hole HL may be reduced.

A horizontal interval of adjacent gate lines on the first gate layer GAT1 in the hole surrounding area may be less than a horizontal interval of adjacent gate lines on the first gate layer GAT1 in the normal area. A horizontal interval of adjacent connecting lines of the back gate electrodes on the second gate layer GAT2 in the hole surrounding area may be less than a horizontal interval of adjacent connecting lines of the back gate electrodes on the second gate layer GAT2 in the normal area. A horizontal interval of adjacent gate lines on the third gate layer GAT3 in the hole surrounding area may be less than a horizontal interval of adjacent gate lines on the third gate layer GAT3 in the normal area. Thus, the dead space due to the hole HL may be further reduced in the hole surrounding area.

In addition, in the illustrated example embodiment, the first gate layer GAT1, the second gate layer GAT2, the third gate layer GAT3, the first source-drain layer SD1 and the second source-drain layer SD2 may overlap one another in the thickness direction in the hole surrounding area. Thus, the dead space due to the hole HL may be further reduced in the hole surrounding area.

Although the gate layer GAT1, the second gate layer GAT2, the third gate layer GAT3, the first source-drain layer SD1 and the second source-drain layer SD2 may overlap one another in the thickness direction in the hole surrounding area as illustrated in FIG. 9 to reduce dead space due to the hole HL, in one or more example embodiments, one or more of the gate layer GAT1, the second gate layer GAT2, the third gate layer GAT3, the first source-drain layer SD1 and the second source-drain layer SD2 may not overlap with the other layers.

According to the illustrated example embodiment, when the hole HL is formed in an active area AA of the display panel 100 and the patterns on the gate layer GAT1, GAT2 and GAT3 and the patterns on the source-drain layer SD1 and SD2 detour the hole HL at the hole surrounding area, the patterns on the gate layer GAT1, GAT2 and GAT3 and the patterns on the source-drain layer SD1 and SD2 are overlapped with one another in the thickness direction so that the dead space adjacent to the hole surrounding area may be reduced.

Figure 10:
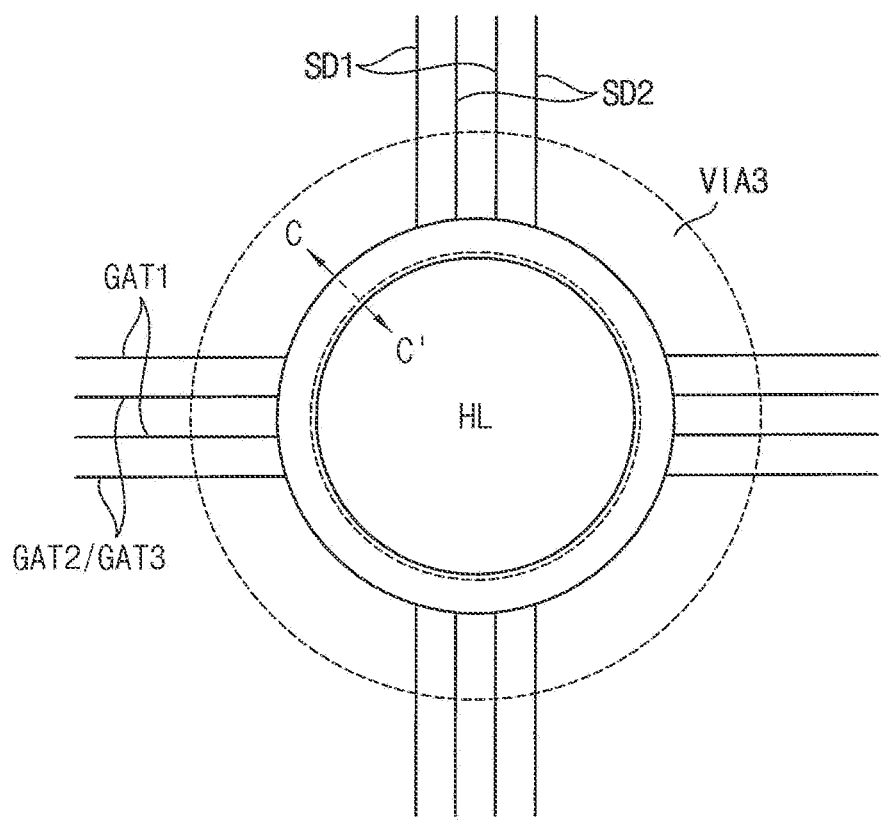
FIG. 10 is a plan view illustrating a hole, a hole surrounding area and a normal area of a display panel according to an example embodiment of the present inventive concept.
Figure 11:
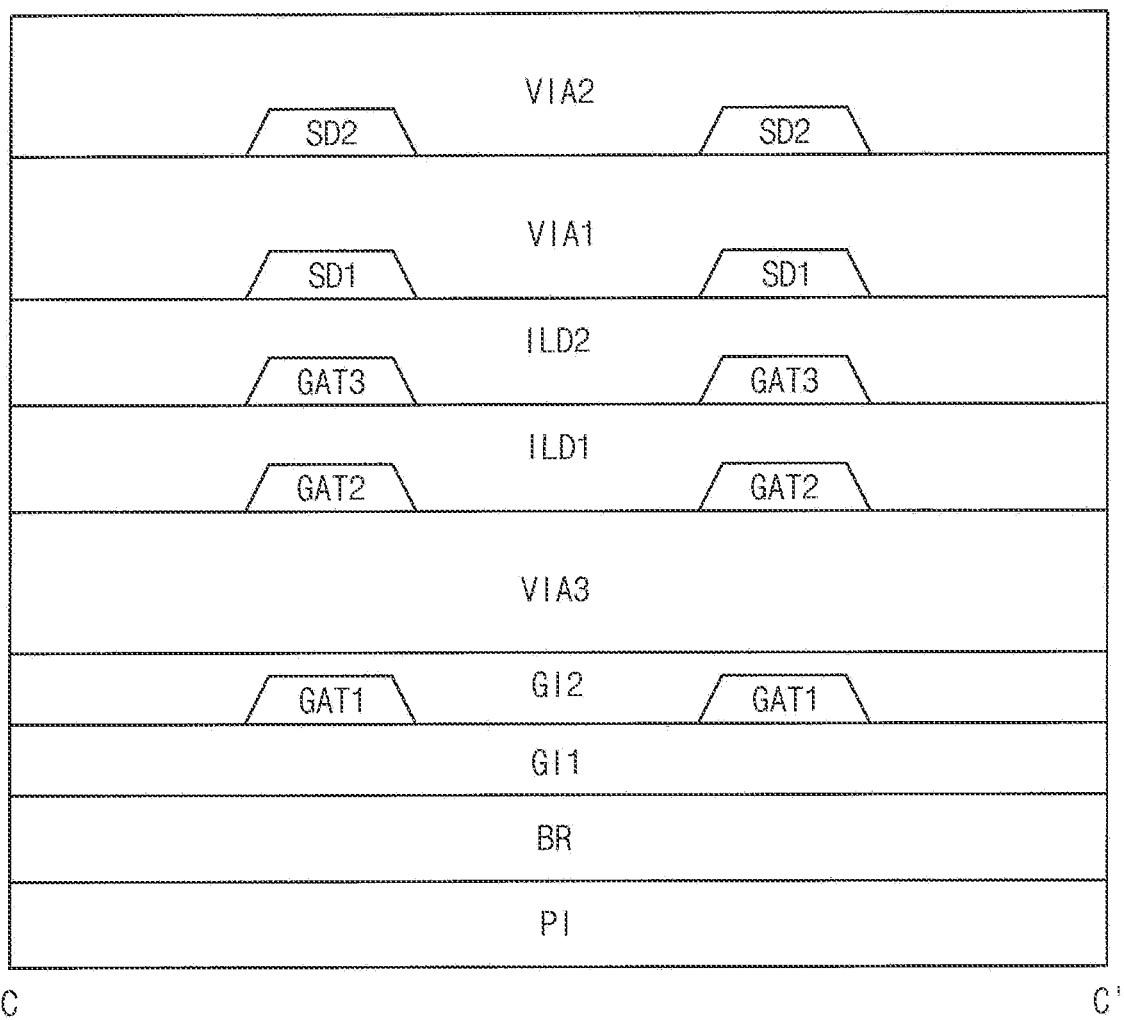
FIG. 11 is a cross-sectional view illustrating the display panel along the line C-C' of FIG. 10.

FIG. 10 is a plan view illustrating a hole, a hole surrounding area and a normal area of a display panel according to an example embodiment of the present inventive concept. FIG. 11 is a cross-sectional view illustrating the display panel along the line C-C' of FIG. 10.

The display panel and the display apparatus including the display panel according to the illustrated example embodiment is substantially the same as the display panel and the display apparatus including the display panel of the previous example embodiment explained in reference to FIGS. 1-9 except for a layer structure of the display panel in the hole surrounding area. Thus, the same reference numerals will be used to refer to the same or like parts as those described in the previous example embodiment of FIGS. 1-9 and any repetitive or redundant explanation concerning the above elements may be omitted.

Referring to FIGS. 1-5, 7, 8, 10 and 11, the display apparatus includes a display panel 100 and a display panel driver. The display panel driver includes a driving controller 200, a gate driver 300, a gamma reference voltage generator 400, a data driver 500 and an emission driver 600.

The display panel 100 includes an active area AA where the image is displayed and a peripheral area PA surrounding the active area AA. The hole HL may be disposed in the active area AA. The hole HL may be formed corresponding to a location of a camera module of the display apparatus.

The display panel 100 may include a plurality of gate layers GAT1, GAT2 and GAT3 including gate patterns extended in the first direction D1 and a plurality of source-drain layers SD1 and SD2 including source-drain patterns extended in the second direction D2.

The display panel 100 includes a base layer PI, a barrier layer BR disposed on the base layer PI, a first gate insulating layer GI1 disposed on the barrier layer BR, a first gate layer GAT1 disposed on the first gate insulating layer GI1, a second gate insulating layer GI2 disposed on the first gate layer GAT1 and/or the first gate insulating layer GI1, a second gate layer GAT2 disposed on the second gate insulating layer GI2, a first passivation layer ILD1 disposed on the second gate layer GAT2 and/or the second gate insulating layer GI2, a third gate layer GAT3 disposed on the first passivation layer ILD1, a second passivation layer ILD2 disposed on the third gate layer GAT3 and/or the first passivation layer ILD1, a first source-drain layer SD1 disposed on the second passivation layer ILD2, a first organic insulating layer VIA1 disposed on the first source-drain layer SD1 and/or the second passivation layer ILD2, a second source-drain layer SD2 disposed on the first organic insulating layer VIA1 and a second organic insulating layer VIA2 disposed on the second source-drain layer SD2 and/or the first organic insulating layer VIA1.

As illustrated in FIG. 11, the display panel 100 may further include a third organic insulating layer VIA3 disposed only in the hole surrounding area and disposed between the second gate insulating layer GI2 and the second gate layer GAT2.

The first organic insulating layer VIA1, the second organic insulating layer VIA2 and the third organic insulating layer VIA3 may include an organic insulating material. A thickness of the first organic insulating layer VIA1, a thickness of the second organic insulating layer VIA2 and a thickness of the third organic insulating layer VIA3 may be greater than the thickness of the first gate insulating layer GI1 and the thickness of the second gate insulating layer GI2. The thickness of the first organic insulating layer VIA1, the thickness of the second organic insulating layer VIA2 and the thickness of the third organic insulating layer VIA3 may be greater than the thickness of the first passivation layer ILD1 and the thickness of the second passivation layer ILD2. The thickness of the first organic insulating layer VIA1 may be between about 1.5 um and about 2 um. The thickness of the second organic insulating layer VIA2 may be between about 1.5 um and about 2 um. The thickness of the third organic insulating layer VIA3 may be between about 1.5 um and about 2 um.

In the illustrated example embodiment, the first gate layer GAT1, the second gate layer GAT2, the third gate layer GAT3, the first source-drain layer SD1 and the second source-drain layer SD2 may overlap one another in the thickness direction in the hole surrounding area. Thus, the dead space due to the hole HL may be reduced in the hole surrounding area.

The first gate layer GAT1 and the second gate layer GAT2 may output gate signals having different waveforms. In this case, it may be desirable to reduce or prevent coupling between the first gate layer GAT1 and the second gate layer GAT2. Therefore, when the first gate layer GAT1 and the second gate layer GAT2 overlap each other in the thickness direction, coupling between the first gate layer GAT1 and the second gate layer GAT2 may be generated. Thus, as illustrated in FIG. 11, the third organic insulating layer VIA3 may be formed between the first gate layer GAT1 and the second gate layer GAT2 so that the coupling between the first gate layer GAT1 and the second gate layer GAT2 may be prevented or reduced. In one or more example embodiments, the organic insulating layer VIA3 has a thickness sufficient to prevent or substantially prevent coupling between the first gate layer GAT1 and the second gate layer GAT2.

According to the illustrated example embodiment, when the hole HL is formed in an active area AA of the display panel 100 and the patterns on the gate layer GAT1, GAT2 and GAT3 and the patterns on the source-drain layer SD1 and SD2 detour the hole HL at the hole surrounding area, the patterns on the gate layer GAT1, GAT2 and GAT3 and the patterns on the source-drain layer SD1 and SD2 are overlapped with one another in the thickness direction so that the dead space adjacent to the hole surrounding area may be reduced.

Figure 12:
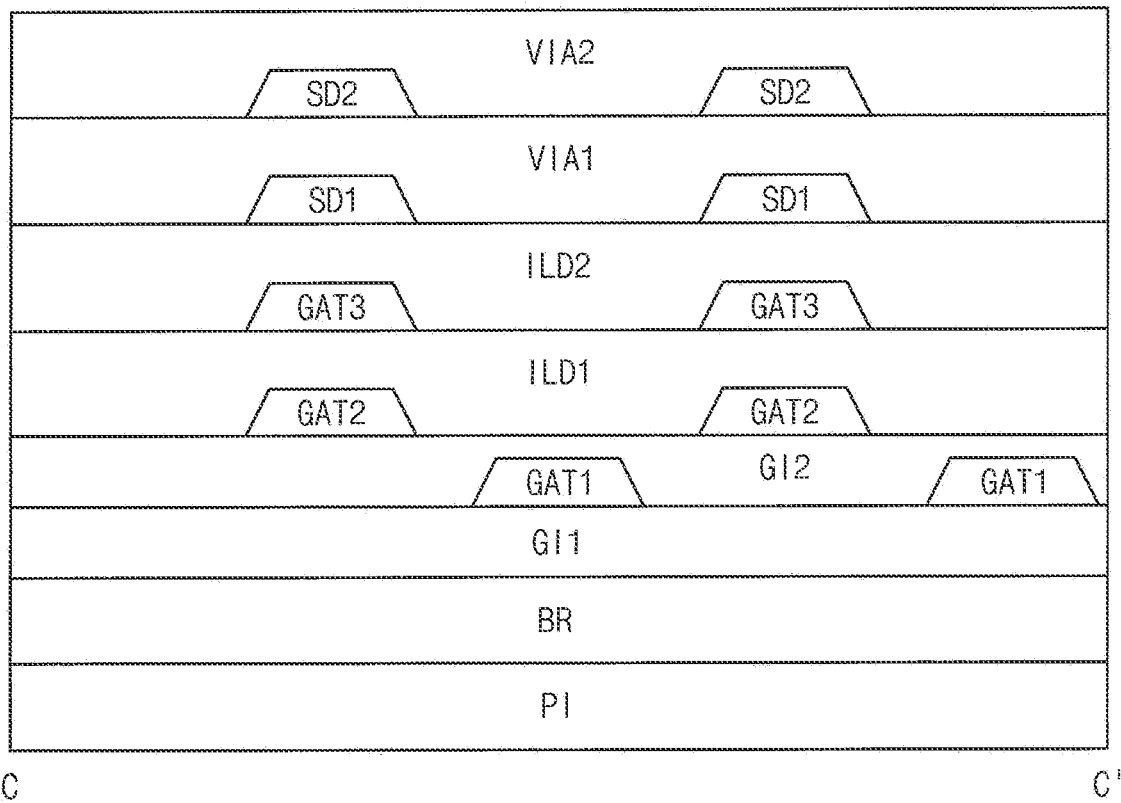
FIG. 12 is a cross-sectional view illustrating a hole surrounding area of a display panel according to an example embodiment of the present inventive concept.

FIG. 12 is a cross-sectional view illustrating a hole surrounding area of a display panel according to an example embodiment of the present inventive concept.

The display panel and the display apparatus including the display panel according to the illustrated example embodiment is substantially the same as or similar to the display panel and the display apparatus including the display panel of the previous example embodiments explained in reference to FIGS. 1-9 except for a layer structure of the display panel in the hole surrounding area. Thus, the same reference numerals will be used to refer to the same or like parts as those described in the previous example embodiment of FIGS. 1-9 and any repetitive or redundant explanation concerning the above elements may be omitted.

Referring to FIGS. 1-8 and 12, the display apparatus includes a display panel 100 and a display panel driver. The display panel driver includes a driving controller 200, a gate driver 300, a gamma reference voltage generator 400, a data driver 500 and an emission driver 600.

The display panel 100 includes an active area AA where the image is displayed and a peripheral area PA surrounding the active area AA. The hole HL may be disposed in the active area AA. The hole HL may be formed corresponding to a location of a camera module of the display apparatus.

The display panel 100 may include a plurality of gate layers GAT1, GAT2 and GAT3 including gate patterns extended in the first direction D1 and a plurality of source-drain layers SD1 and SD2 including source-drain patterns extended in the second direction D2.

The display panel 100 includes a base layer PI, a barrier layer BR disposed on the base layer PI, a first gate insulating layer GI1 disposed on the barrier layer BR, a first gate layer GAT1 disposed on the first gate insulating layer GI1, a second gate insulating layer GI2 disposed on the first gate layer GAT1 and/or the first gate insulating layer GI1, a second gate layer GAT2 disposed on the second gate insulating layer GI2, a first passivation layer ILD1 disposed on the second gate layer GAT2 and/or the second gate insulating layer GI2, a third gate layer GAT3 disposed on the first passivation layer ILD1, a second passivation layer ILD2 disposed on the third gate layer GAT3 and/or the first passivation layer ILD1, a first source-drain layer SD1 disposed on the second passivation layer ILD2, a first organic insulating layer VIA1 disposed on the first source-drain layer SD1 and/or the second passivation layer ILD2, a second source-drain layer SD2 disposed on the first organic insulating layer VIA1 and a second organic insulating layer VIA2 disposed on the second source-drain layer SD2 and/or the first organic insulating layer VIA1.

As illustrated in FIG. 8, the second gate layer GAT2 may overlap the third gate layer GAT3 in a thickness direction in the normal area and the first gate layer GAT1 may not overlap the second gate layer GAT2 and the third gate layer GAT3 in the thickness direction in the normal area.

As illustrated in FIG. 12, the second gate layer GAT2 may overlap the third gate layer GAT3 in a thickness direction in the hole surrounding area and the first gate layer GAT1 may not overlap the second gate layer GAT2 and the third gate layer GAT3 in the thickness direction in the hole surrounding area.

In the illustrated example embodiment, the second gate layer GAT2, the third gate layer GAT3, the first source-drain layer SD1 and the second source-drain layer SD2 may overlap one another in the thickness direction in the hole surrounding area. Thus, the dead space due to the hole HL may be reduced in the hole surrounding area.

The first gate layer GAT1 and the second gate layer GAT2 output the gate signals having different waveforms. In this case, it may be desirable to prevent or reduce the coupling between the first gate layer GAT1 and the second gate layer GAT2. In the illustrated example embodiment, the patterns on the first gate layer GAT1 and the patterns on the second gate layer GAT2 may be alternately disposed so that a distance between the patterns on the first gate layer GAT1 and the patterns on the second gate layer GAT2 may be greater than a distance between the patterns on the first gate layer GAT1 and the patterns on the second gate layer GAT2 in a vertical overlap structure in FIG. 9. Thus, coupling between the first gate layer GAT1 and the second gate layer GAT2 may be prevented or reduced.

According to the illustrated example embodiment, when the hole HL is formed in an active area AA of the display panel 100 and the patterns on the gate layer GAT1, GAT2 and GAT3 and the patterns on the source-drain layer SD1 and SD2 detour the hole HL at the hole surrounding area, a part of the patterns on the gate layer GAT2 and GAT3 and the patterns on the source-drain layer SD1 and SD2 are overlapped with one another in the thickness direction so that the dead space adjacent to the hole surrounding area may be reduced.

Figure 13:
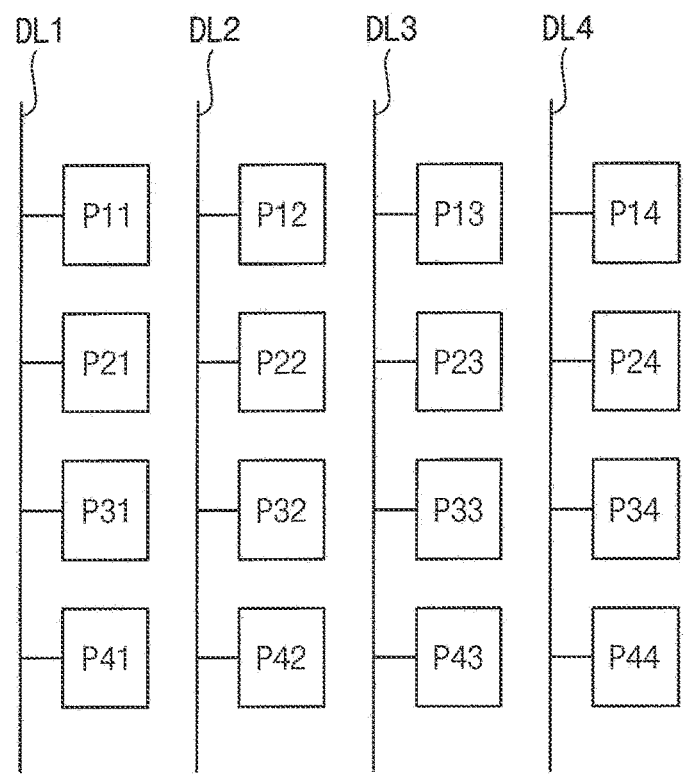
FIG. 13 is a conceptual diagram illustrating a pixel structure of a display panel according to an example embodiment of the present inventive concept.
Figure 14:
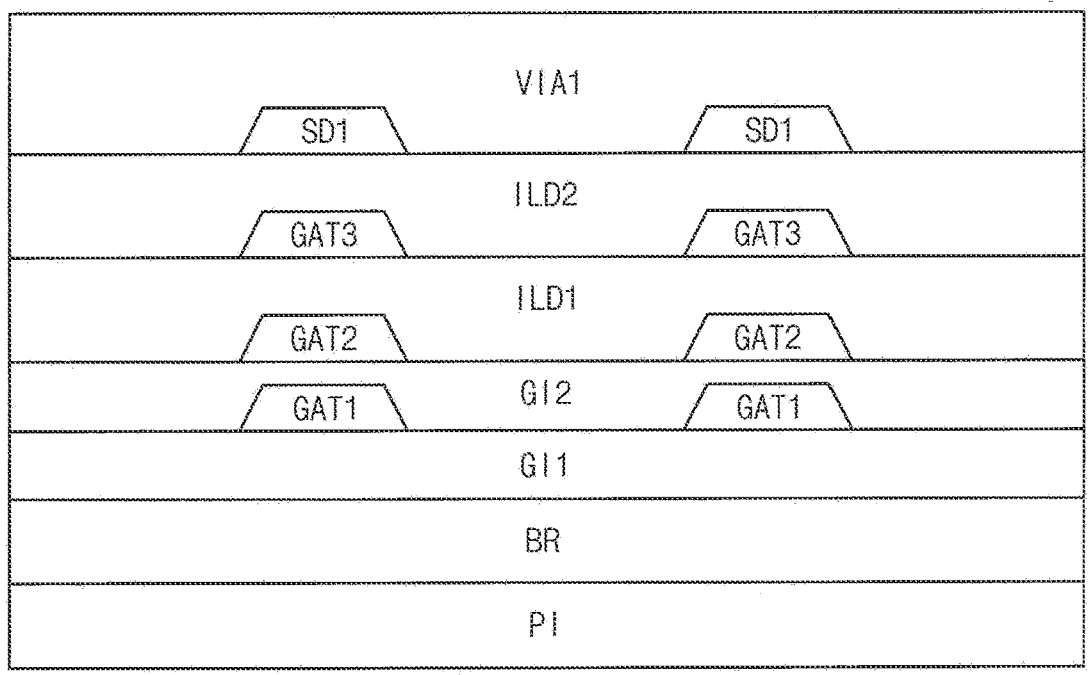
FIG. 14 is a cross-sectional view illustrating a hole surrounding area of the display panel of FIG. 13.

FIG. 13 is a conceptual diagram illustrating a pixel structure of a display panel according to an example embodiment of the present inventive concept. FIG. 14 is a cross-sectional view illustrating a hole surrounding area of the display panel of FIG. 13.

The display panel and the display apparatus including the display panel according to the illustrated example embodiment is substantially the same as the display panel and the display apparatus including the display panel of the previous example embodiment explained in reference to FIGS. 1-9 except for a pixel structure of the display panel and a layer structure of the display panel in the hole surrounding area. Thus, the same reference numerals will be used to refer to the same or like parts as those described in the previous example embodiment of FIGS. 1-9 and any repetitive or redundant explanation concerning the above elements may be omitted.

Referring to FIGS. 1-3, 5, 8, 13 and 14, the display apparatus includes a display panel 100 and a display panel driver. The display panel driver includes a driving controller 200, a gate driver 300, a gamma reference voltage generator 400, a data driver 500 and an emission driver 600.

The display panel 100 includes an active area AA where the image is displayed and a peripheral area PA surrounding the active area AA. The hole HL may be disposed in the active area AA. The hole HL may be formed corresponding to a location of a camera module of the display apparatus.

The display panel 100 may include a plurality of gate layers GAT1, GAT2 and GAT3 including gate patterns extended in the first direction D1 and a source-drain layer SD1 including source-drain patterns extended in the second direction D2.

The display panel 100 includes a base layer PI, a barrier layer BR disposed on the base layer PI, a first gate insulating layer GI1 disposed on the barrier layer BR, a first gate layer GAT1 disposed on the first gate insulating layer GI1, a second gate insulating layer GI2 disposed on the first gate layer GAT1 and/or the first gate insulating layer GI1, a second gate layer GAT2 disposed on the second gate insulating layer GI2, a first passivation layer ILD1 disposed on the second gate layer GAT2 and/or the second gate insulating layer GI2, a third gate layer GAT3 disposed on the first passivation layer ILD1, a second passivation layer ILD2 disposed on the third gate layer GAT3 and/or the first passivation layer ILD1, a source-drain layer SD1 disposed on the second passivation layer ILD2 and an organic insulating layer VIA1 disposed on the source-drain layer SD1 and/or the second passivation layer ILD2.

As illustrated in FIG. 13, the display panel 100 includes a plurality of pixels disposed in a matrix form.

In the illustrated example embodiment, pixels in a pixel column may be connected to a single data line adjacent to the pixel column.

For example, pixels P11, P21, P31 and P41 disposed in a first pixel column of the display panel 100 may be connected to a first data line DL1. For example, pixels P12, P22, P32 and P42 disposed in a second pixel column of the display panel 100 may be connected to a second data line DL2. For example, pixels P13, P23, P33 and P43 disposed in a third pixel column of the display panel 100 may be connected to a third data line DL3. For example, pixels P14, P24, P34 and P44 disposed in a fourth pixel column of the display panel 100 may be connected to a fourth data line DL4.

The source-drain layer SD1 of FIG. 14 may include the first data line DL1, the second data line DL2, the third data line DL3 and the fourth data line DL4.

In the illustrated example embodiment, the first gate layer GAT1, the second gate layer GAT2, the third gate layer GAT3 and the source-drain layer SD1 may overlap one another in the thickness direction in the hole surrounding area. Thus, the dead space due to the hole HL may be reduced in the hole surrounding area.

According to the illustrated example embodiment, when the hole HL is formed in an active area AA of the display panel 100 and the patterns on the gate layer GAT1, GAT2 and GAT3 and the patterns on the source-drain layer SD1 detour the hole HL at the hole surrounding area, the patterns on the gate layer GAT1, GAT2 and GAT3 and the patterns on the source-drain layer SD1 are overlapped with one another in the thickness direction so that the dead space adjacent to the hole surrounding area may be reduced.

According to aspects of example embodiments of the present inventive concept as explained above, the dead space of the hole surrounding area in the active area of the display panel may be reduced.

The terminology used herein is for the purpose of describing particular example embodiments only and is not intended to limit the example embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the term "and/or" includes any and all combinations of one or more of the associated listed items.

Further, the use of "may" when describing embodiments of the present disclosure refers to "one or more example embodiments of the present disclosure".

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, between 2.4 and 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

As used herein, the phrases such as, "a plan view" may refer to a view from top or from a direction normal to the display surface of the display panel. A "thickness direction" may refer to a direction normal or perpendicular to the display surface of the display panel.

The foregoing is illustrative of the present inventive concept and is not to be construed as limiting thereof. Although a few example embodiments of the present inventive concept have been described, those skilled in the art will readily appreciate that many modifications are possible in the example embodiments without materially departing from the novel teachings and aspects of the present inventive concept. Accordingly, all such modifications are intended to be included within the scope of the present inventive concept as defined in the claims. Therefore, it is to be understood that the foregoing is illustrative of the present inventive concept and is not to be construed as limited to the specific example embodiments disclosed, and that modifications to the disclosed example embodiments, as well as other example embodiments, are intended to be included within the scope of the appended claims. The present inventive concept is defined by the following claims, with equivalents of the claims to be included therein.

What is claimed is:

1. A display panel comprising:
   a first metal layer on a first plane;
   a second metal layer on a second plane different from the first plane; and
   a third metal layer on a third plane different from the first plane and the second plane,
   wherein a first pattern of the first metal layer is curved or bent along a hole surrounding area corresponding to a periphery of a hole in an active area,
   wherein a second pattern of the second metal layer is curved or bent along the hole surrounding area,
   wherein a third pattern of the third metal layer is curved or bent along the hole surrounding area,
   wherein a curved or bent portion of the first pattern, a curved or bent portion of the second pattern and a curved or bent portion of the third pattern are overlapped in a thickness direction of the display panel in the hole surrounding area.

2. The display panel of claim 1, wherein the first metal layer comprises a first gate layer,
   wherein the second metal layer comprises a second gate layer, and
   wherein the third metal layer comprises a source-drain layer.

3. The display panel of claim 2, wherein the first gate layer is to receive a first gate signal, and
   wherein the second gate layer is to receive a second gate signal different from the first gate signal.

4. The display panel of claim 2, further comprising a pixel comprising a P-type transistor and an N-type transistor.

5. The display panel of claim 4, wherein the first gate layer comprises a P-type gate line configured to transmit a P-type gate signal to the P-type transistor,
   wherein the second gate layer comprises a back gate electrode of the P-type transistor or the N-type transistor and a connecting line of the back gate electrode.

6. The display panel of claim 4, wherein the first gate layer comprises a P-type gate line configured to transmit a P-type gate signal to the P-type transistor,
   wherein the second gate layer comprises an N-type gate line configured to transmit an N-type gate signal to the N-type transistor.

7. The display panel of claim 2, further comprising:
   a second gate insulating layer on the first gate layer; and
   a first passivation layer on the second gate layer.

8. The display panel of claim 7, further comprising:
   a third gate layer on the first passivation layer; and
   a second passivation layer on the third gate layer,
   wherein the source-drain layer is on the second passivation layer.

9. The display panel of claim 8, wherein a fourth pattern of the third gate layer is curved or bent along the hole surrounding area,
   wherein the curved or bent portion of the first pattern, the curved or bent portion of the second pattern and the curved or bent portion of the third pattern and a curved or bent portion of the fourth pattern are overlapped in the thickness direction of the display panel in the hole surrounding area.

10. The display panel of claim 8, further comprising a pixel comprising a P-type transistor and an N-type transistor.

11. The display panel of claim 10, wherein the first gate layer comprises a P-type gate line configured to transmit a P-type gate signal to the P-type transistor,
    wherein the second gate layer comprises a back gate electrode of the P-type transistor or the N-type transistor and a connecting line of the back gate electrode, and
    wherein the third gate layer comprises an N-type gate line configured to transmit an N-type gate signal to the N-type transistor.

12. The display panel of claim 2, wherein the first gate layer does not overlap the second gate layer in the thickness direction in a normal area, which is not the hole surrounding area.

13. The display panel of claim 2, further comprising:
a first organic insulating layer on the source-drain layer;
a second source-drain layer on the first organic insulating layer; and
a second organic insulating layer on the second source-drain layer.

14. The display panel of claim 13, wherein the source-drain layer does not overlap the second source-drain layer in the thickness direction in a normal area, which is not the hole surrounding area.

15. The display panel of claim 14, wherein the source-drain layer overlaps the second source-drain layer in the thickness direction in the hole surrounding area.

* * * * *